US012629779B2

(12) United States Patent
Saito

(10) Patent No.: US 12,629,779 B2
(45) Date of Patent: May 19, 2026

(54) PROCESSING METHOD OF WORKPIECE

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 744 days.

(21) Appl. No.: 18/062,078

(22) Filed: Dec. 6, 2022

(65) Prior Publication Data

US 2023/0191537 A1    Jun. 22, 2023

(30) Foreign Application Priority Data

Dec. 22, 2021    (JP) ................................. 2021-207804

(51) Int. Cl.
| | |
|---|---|
| *H10P 72/70* | (2026.01) |
| *B23K 26/38* | (2014.01) |
| *H10P 72/00* | (2026.01) |
| *B23K 103/00* | (2006.01) |

(52) U.S. Cl.
CPC .......... *B23K 26/38* (2013.01); *H10P 72/0428* (2026.01); *H10P 72/7402* (2026.01); *B23K 2103/42* (2018.08); *H10P 72/742* (2026.01)

(58) Field of Classification Search
CPC ............... H01L 21/78; H01L 21/67092; H01L 21/6836; H01L 2221/68336; H01L 21/67132; H01L 2221/68327; H01L 2221/6834; H01L 2221/68386; H01L 21/6835; H01L 2221/68381; B23K 26/38; B23K 2103/42
See application file for complete search history.

(56) References Cited

U.S. PATENT DOCUMENTS

| | | | | |
|---|---|---|---|---|
| 2007/0284038 A1* | 12/2007 | Yamamoto | ........ | H01L 21/67132 |
| | | | | 156/391 |
| 2018/0233395 A1* | 8/2018 | Okita | .................. | H01L 21/3065 |

FOREIGN PATENT DOCUMENTS

| | | | |
|---|---|---|---|
| JP | 2003338477 A | | 11/2003 |
| JP | 2004063678 A | | 2/2004 |
| JP | 2007134390 A | | 5/2007 |
| JP | 2011086772 A | * | 4/2011 |

(Continued)

OTHER PUBLICATIONS

Office Action issued by the Intellectual Property Office of Singapore in corresponding SG Patent Application No. 10202260308U, dated Sep. 1, 2025.

(Continued)

*Primary Examiner* — Tiffany T Tran
(74) *Attorney, Agent, or Firm* — Greer Burns & Crain Ltd.

(57) ABSTRACT

There is provided a processing method of a workpiece by which the workpiece is processed. The processing method includes a thermocompression bonding step of executing thermocompression bonding of a first sheet composed of a thermoplastic resin to a front surface side of the workpiece by disposing the first sheet on the front surface side of the workpiece and heating the first sheet, a processing step of processing the workpiece together with the first sheet, and a separation step of separating the first sheet from the workpiece by moving a second sheet composed of a thermoplastic resin after executing thermocompression bonding of the second sheet to the first sheet by disposing the second sheet on the first sheet processed and heating the second sheet.

11 Claims, 12 Drawing Sheets

(56)                    References Cited

FOREIGN PATENT DOCUMENTS

| JP | 2020077812 | A | * | 5/2020 | ....... | H01L 21/67248 |
| JP | 2021-168365 | A | | 10/2021 | | |

OTHER PUBLICATIONS

Office Action issued by the German Patent Office in corresponding German Patent Application No. 10 2022 213 700.0, dated May 21, 2025.

Office Action issued in counterpart Japanese patent application No. 2021-207804, dated Jul. 8, 2025.

* cited by examiner

START

EXECUTE THERMOCOMPRESSION
BONDING OF FIRST SHEET TO FRONT
SURFACE SIDE OF WORKPIECE — S1

DISPOSE SUPPORT COMPONENT ON
BACK SURFACE SIDE OF WORKPIECE — S2

PROCESS WORKPIECE TOGETHER WITH
FIRST SHEET — S3

UNIFY PROCESSED FIRST SHEET — S4

EXECUTE THERMOCOMPRESSION
BONDING OF SECOND SHEET TO FIRST
SHEET AND SEPARATE FIRST SHEET FROM
WORKPIECE — S5

END

PROCESSING METHOD OF WORKPIECE

BACKGROUND OF THE INVENTION

Field of the Invention

The present invention relates to a processing method of a workpiece by which the workpiece such as a wafer is processed.

Description of the Related Art

In a manufacturing process of device chips, a wafer in which a device is formed in each of a plurality of regions marked out by a plurality of streets (planned dividing lines) arranged in a lattice manner is used. By dividing this wafer along the streets, a plurality of device chips each including the device are obtained. The device chips are incorporated into various pieces of electronic equipment such as mobile phones and personal computers.

A cutting apparatus is used for the dividing of the wafer. The cutting apparatus includes a chuck table that holds a workpiece and a cutting unit that cuts the workpiece, and an annular cutting blade is mounted on the cutting unit. By holding the wafer by the chuck table and causing the cutting blade to cut into the wafer while rotating the cutting blade, the wafer is cut and divided. Furthermore, in recent years, development of a process of dividing a wafer by laser processing by use of a laser processing apparatus has also been being advanced. The laser processing apparatus includes a chuck table that holds a workpiece and a laser irradiation unit that executes irradiation with a laser beam with a predetermined wavelength. By holding a wafer by the chuck table and irradiating the wafer with the laser beam from the laser irradiation unit, ablation processing or the like is executed for the wafer, and the wafer is divided.

When a wafer is processed by a processing apparatus such as the cutting apparatus or the laser processing apparatus, dust generated due to the processing of the wafer (processing dust) is scattered. For example, when a wafer is cut by the cutting apparatus, cutting dust of the wafer is generated in a contact region between the wafer and the cutting blade. Furthermore, when the laser processing is executed for a wafer by the laser processing apparatus, a melt (debris) is generated in the region irradiated with the laser beam in the wafer. When the processing dust such as the cutting dust or the debris is scattered, there is a fear that a front surface side (surface side on which devices are formed) of the wafer is contaminated by the processing dust. Thus, a protective tape (adhesive tape) is stuck to the front surface side of a wafer when the wafer is processed by the processing apparatus (refer to Japanese Patent Laid-open No. 2007-134390). The protective tape includes a base and an adhesive applied on a surface of the base and is stuck in such a manner that the adhesive side gets contact with the front surface side of the wafer. Then, the workpiece is processed together with the protective tape in the state in which the front surface side is covered by the protective tape. This can prevent the processing dust from adhering to the front surface side of the wafer.

The protective tape is separated and removed from the workpiece after the processing of the workpiece. At this time, part of the adhesive remains on the front surface side of the wafer and the front surface side of the wafer is contaminated by a residue of the adhesive in some cases. Thus, a processing method in which a thermocompression bonding sheet that does not include an adhesive is used instead of the protective tape has been proposed (refer to Japanese Patent Laid-open No. 2020-77812). When the thermocompression bonding sheet is used, an adhesive does not remain on a wafer even when the thermocompression bonding sheet is separated after processing of the wafer, and therefore contamination due to the residue of the adhesive is avoided.

SUMMARY OF THE INVENTION

In the case of using a sheet that does not include an adhesive (thermocompression bonding sheet) when a workpiece such as a wafer is processed as described above, the sheet is thermocompression-bonded to the workpiece by being heated and softened. Then, after the processing of the workpiece is completed, a tape for separation is stuck to the sheet and the tape for separation is moved in such a direction as to get farther away from the workpiece and thereby the sheet is separated and removed from the workpiece together with the tape for separation. However, when the sheet is thermocompression-bonded to the workpiece, the softened sheet gets deformed along the shape of the front surface side of the workpiece and firmly gets close contact with the workpiece. Thus, when sticking the tape for separation to the sheet and separating the sheet from the workpiece is attempted, the bonding between the workpiece and the sheet is stronger than the bonding between the sheet and the tape for separation, and the tape for separation detaches from the sheet in the middle of the separation in some cases. That is, when the sheet is thermocompression-bonded to the workpiece, there is a problem that it becomes difficult to separate the sheet from the workpiece after processing.

The present invention is made in view of such a problem and intends to provide a processing method of a workpiece in which it is possible to surely separate a sheet fixed to the workpiece by thermocompression bonding.

In accordance with an aspect of the present invention, there is provided a processing method of a workpiece by which the workpiece is processed. The processing method includes a thermocompression bonding step of executing thermocompression bonding of a first sheet composed of a thermoplastic resin to the front surface side of the workpiece by disposing the first sheet on the front surface side of the workpiece and heating the first sheet, a processing step of processing the workpiece together with the first sheet, and a separation step of separating the first sheet from the workpiece by moving a second sheet composed of a thermoplastic resin after executing thermocompression bonding of the second sheet to the first sheet by disposing the second sheet on the first sheet processed and heating the second sheet.

Preferably, in the processing step, the workpiece is processed together with the first sheet by causing a cutting blade to cut into the workpiece and the first sheet or irradiating the workpiece and the first sheet with a laser beam or supplying gas in a plasma state to the workpiece and the first sheet.

Furthermore, preferably, the processing method of a workpiece further includes a support component disposing step of disposing a support component on a back surface side of the workpiece before the processing step. Moreover, preferably, the processing method of a workpiece further includes a unifying step of unifying the first sheet processed, before the separation step, by heating and melting the first sheet processed.

Furthermore, preferably, devices are formed on the front surface side of the workpiece.

In the processing method of a workpiece according to the one aspect of the present invention, after the second sheet is thermocompression-bonded to the processed first sheet, the first sheet is separated from the workpiece by moving the second sheet. Due to this, the separation of the first sheet can be executed in the state in which the adhesiveness between the first sheet and the second sheet is high, and detachment between the first sheet and the second sheet in the separation is prevented. As a result, it becomes possible to surely separate the first sheet firmly fixed to the workpiece by the thermocompression bonding.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
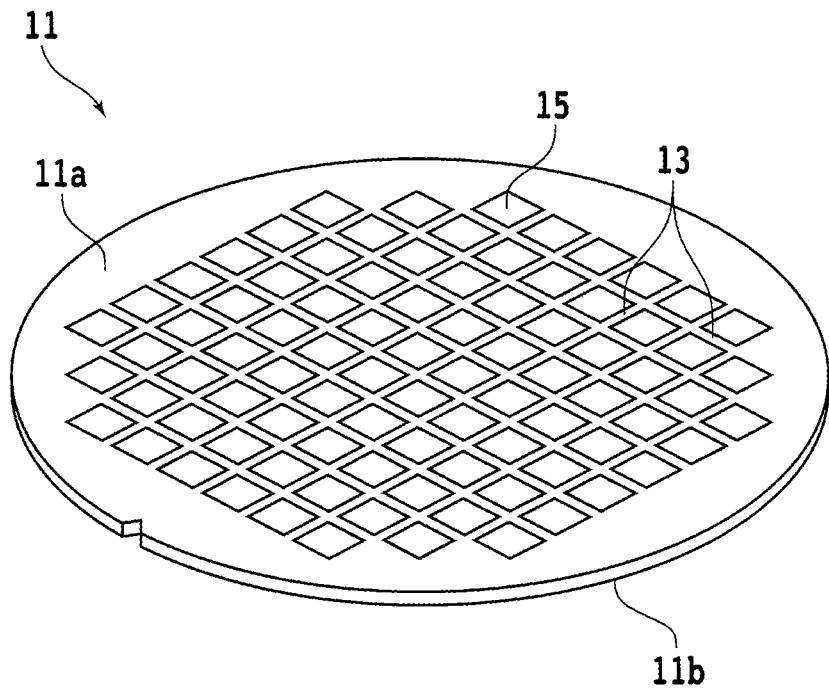
FIG. 1 is a perspective view illustrating a workpiece.

An embodiment according to the one aspect of the present invention will be described with reference to the accompanying drawings. First, a configuration example of a workpiece that can be processed by a processing method of a workpiece according to the present embodiment will be described. FIG. 1 is a perspective view illustrating a workpiece 11.

For example, the workpiece 11 is a circular disc-shaped wafer composed of a semiconductor material such as single-crystal silicon and includes a front surface (first surface) 11a and a back surface (second surface) 11b that are substantially parallel to each other. The workpiece 11 is segmented into a plurality of rectangular regions by streets (planned dividing lines) 13 arranged in a lattice manner to intersect each other. Furthermore, a device 15 such as an integrated circuit (IC), large scale integration (LSI), a light emitting diode (LED), or a micro electro mechanical systems (MEMS) device is formed on the side of the front surface 11a of each of the plurality of regions marked out by the streets 13. However, there is no limit on the material, shape, structure, size, and so forth of the workpiece 11. For example, the workpiece 11 may be a wafer (substrate) composed of a material such as a semiconductor other than silicon (GaAs, InP, GaN, SiC, or the like), sapphire, glass, ceramic, resin, or metal. Moreover, there is no limit also on the kind, quantity, shape, structure, size, arrangement, and so forth of the devices 15.

By dividing the workpiece 11 along the streets 13, device chips each including the device 15 are manufactured. A structure such as a test element group (TEG) for executing inspection of the devices 15 may be disposed on the side of the front surface 11a of the workpiece 11. Furthermore, an electrode that penetrates the workpiece 11 in the thickness direction (via-electrode) may be disposed in the workpiece 11.

Figure 2:
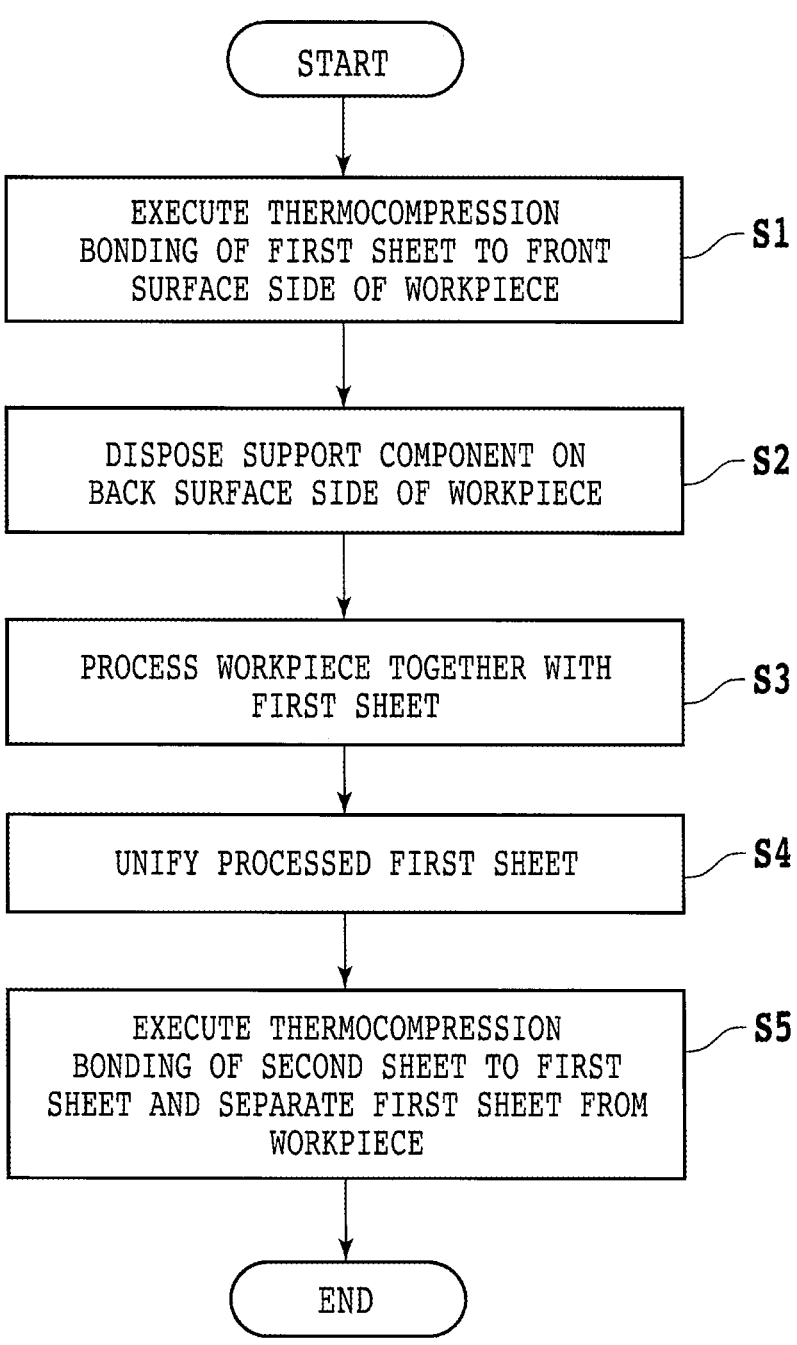
FIG. 2 is a flowchart illustrating a processing method of a workpiece.

For example, the workpiece 11 is processed by using a processing apparatus such as a cutting apparatus, a laser processing apparatus, or a plasma treatment apparatus and is divided into a plurality of device chips. A specific example of the processing method of the workpiece 11 will be described. FIG. 2 is a flowchart illustrating the processing method of the workpiece 11.

Figure 3A:
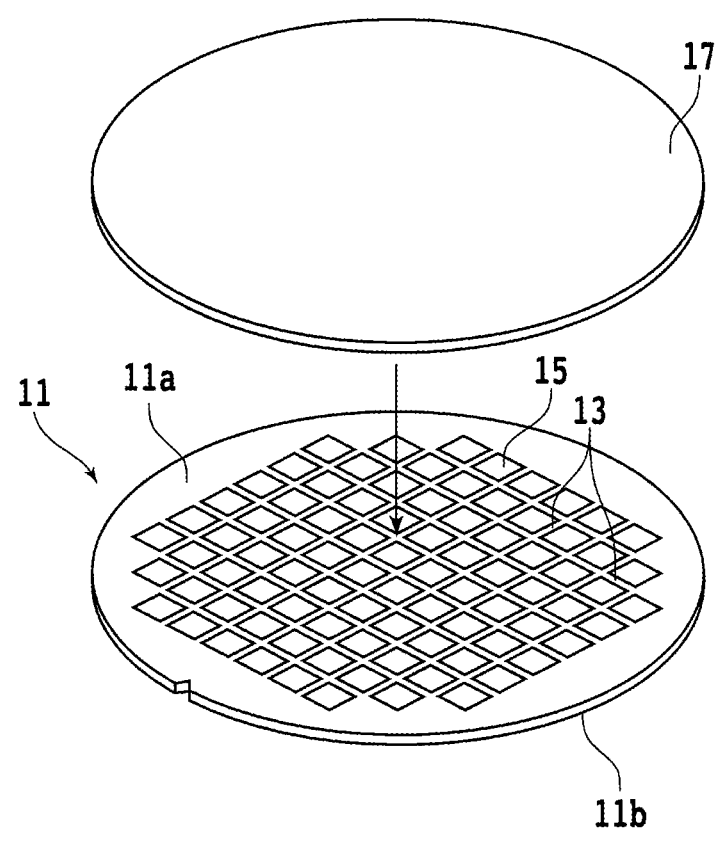
FIG. 3A is a perspective view illustrating the workpiece on which a first sheet is disposed.
Figure 3B:
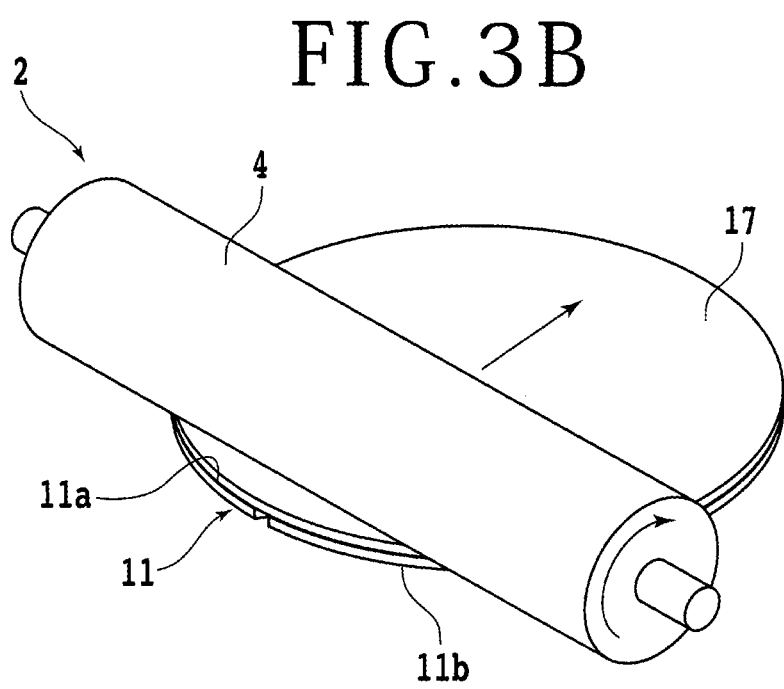
FIG. 3B is a perspective view illustrating the workpiece to which the first sheet is thermocompression-bonded.

First, a thermocompression bonding step of causing thermocompression bonding of a first sheet composed of a thermoplastic resin to the side of the front surface 11a of the workpiece 11 (step S1) is executed. The workpiece 11 in the thermocompression bonding step is illustrated in FIG. 3A and FIG. 3B. In the thermocompression bonding step, a sheet (thermocompression bonding sheet, first sheet) 17 is thermocompression-bonded to the side of the front surface 11a of the workpiece 11.

FIG. 3A is a perspective view illustrating the workpiece 11 on which the sheet 17 is disposed. The sheet 17 is a sheet that can be thermocompression-bonded to the workpiece 11. Specifically, the sheet 17 is composed of a thermoplastic resin with a lower melting point than the workpiece 11 and does not include an adhesive (glue layer). For example, as the sheet 17, an olefin-based sheet, a styrene-based sheet, a polyester-based sheet, or the like is used. As examples of the olefin-based sheet, a polyethylene sheet, a polypropylene sheet, and so forth are cited. As examples of the styrene-based sheet, a polystyrene sheet and so forth are cited. As examples of the polyester-based sheet, a polyethylene terephthalate sheet, a polyethylene naphtholate sheet, and so forth are cited. The shape and size of the sheet 17 are set to allow the sheet 17 to cover the whole of the side of the surface to which the sheet 17 is fixed (side of the front surface 11a) in the workpiece 11. For example, the sheet 17 is formed into a circular shape, and a diameter of the sheet 17 is equal to or larger than that of the workpiece 11. Furthermore, the sheet 17 is disposed to cover the whole of the side of the front surface 11a of the workpiece 11. Due to this, the plurality of devices 15 are covered by the sheet 17 and are protected.

FIG. 3B is a perspective view illustrating the workpiece 11 to which the sheet 17 is thermocompression-bonded. The sheet 17 disposed on the side of the front surface 11a of the workpiece 11 is heated to be thermocompression-bonded to the workpiece 11. For example, the sheet 17 is heated and pressurized by a heating unit 2. The heating unit 2 includes a chuck table (not illustrated) that supports the workpiece 11 and a roller (heat roller) 4 capable of heating. The roller 4 is formed into a circular column shape whose height is equal to or larger than a diameter of the workpiece 11 and internally includes a heat source. When the workpiece 11 is held by the chuck table and the roller 4 heated to a predetermined temperature is brought into contact with the sheet 17 and is rolled on the sheet 17, the sheet 17 is pressed against the side of the front surface 11a of the workpiece 11 while being heated.

The sheet 17 is heated to cause the temperature of the sheet 17 to become equal to or higher than the softening point of the sheet 17 and equal to or lower than the melting point of the sheet 17. However, the sheet 17 often does not have a definite softening point. In this case, the sheet 17 is heated to cause the temperature of the sheet 17 to become equal to or higher than a temperature lower than the melting point of the sheet 17 by a predetermined temperature (for example, 20° C.) and equal to or lower than the melting point of the sheet 17. For example, a heating temperature can be set to at least 120° C. and at most 140° C. when the sheet 17 is a polyethylene sheet, and the heating temperature can be set to at least 160° C. and at most 180° C. when the sheet 17 is a polypropylene sheet. Furthermore, the heating temperature can be set to at least 220° C. and at most 240° C. when the sheet 17 is a polystyrene sheet. Moreover, the heating temperature can be set to at least 250° C. and at most 270° C. when the sheet 17 is a polyethylene terephthalate sheet, and the heating temperature can be set to at least 160° C. and at most 180° C. when the sheet 17 is a polyethylene naphtholate sheet.

When the sheet 17 is pressed against the workpiece 11 while being heated, the sheet 17 softens, and gets deformed along the shape of the side of the front surface 11a of the workpiece 11, and gets close contact with the side of the front surface 11a of the workpiece 11. Thereby, the sheet 17 is thermocompression-bonded to the side of the front surface 11a of the workpiece 11 and is fixed thereto. There is no limit on the method for heating and pressurizing the sheet 17. For example, it is also possible to use a plate-shaped pressing component (plate) internally including a heat source instead of the roller 4. In this case, by pressing the pressing component heated to a predetermined temperature against the sheet 17, the sheet 17 is pressed against the side of the front surface 11a of the workpiece 11 while being heated.

Figure 4A:
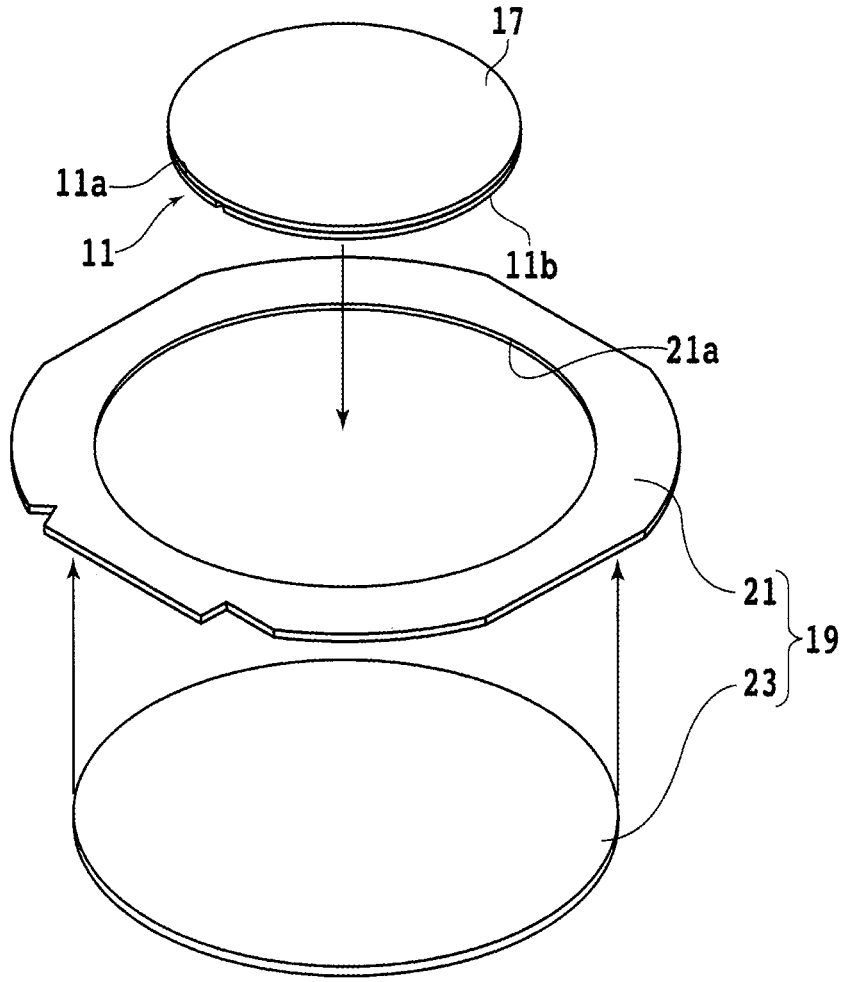
FIG. 4A is a perspective view illustrating the workpiece and a support component in a support component disposing step.

Next, a support component disposing step of disposing a support component on the side of the back surface 11b of the workpiece 11 (step S2) is executed. FIG. 4A is a perspective view illustrating the workpiece 11 and a support component 19 in the support component disposing step.

The support component 19 is a component that supports the side of the back surface 11b of the workpiece 11 and includes, for example, an annular frame 21 and a circular tape 23. The frame 21 is composed of metal such as stainless steel (SUS), and a circular columnar opening 21a that penetrates the frame 21 in the thickness direction is made at a central part of the frame 21. A diameter of the opening 21a is larger than that of the workpiece 11. The tape 23 includes a film-shaped base formed into a circular shape and an adhesive (glue layer) disposed on the base. For example, the base is composed of resin such as polyolefin, polyvinyl chloride, or polyethylene terephthalate. Furthermore, the adhesive is composed of epoxy-based, acrylic-based, or a rubber-based adhesive, or the like. The adhesive may be an ultraviolet-curable resin that cures through irradiation with ultraviolet. In the state in which the workpiece 11 is disposed inside the opening 21a of the frame 21, a central part of the tape 23 is stuck to the side of the back surface 11b of the workpiece 11, and an outer circumferential part of the tape 23 is stuck to the frame 21. Due to this, the workpiece 11 is supported by the frame 21 through the tape 23.

Figure 4B:
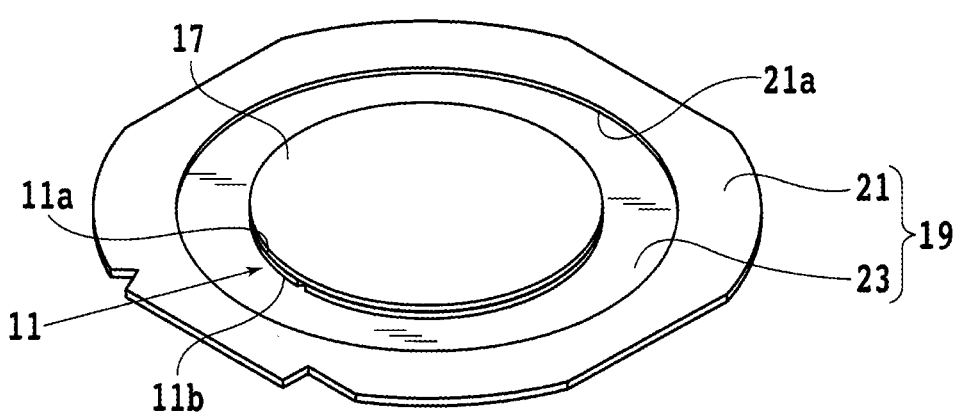
FIG. 4B is a perspective view illustrating the workpiece and the support component after the support component disposing step.

FIG. 4B is a perspective view illustrating the workpiece 11 and the support component 19 after the support component disposing step. When the workpiece 11 is processed by a processing apparatus, the workpiece 11 is supported by the support component 19 for convenience of handling (conveyance, holding, and so forth) of the workpiece 11. However, the support component disposing step may be omitted when the workpiece 11 can be handled alone without being supported by the support component 19.

Next, a processing step of processing the workpiece 11 together with the sheet 17 (step S3) is executed. For example, in the processing step, the workpiece 11 is divided by cutting the workpiece 11 along the streets 13 (see FIG. 1 and so forth) by using a cutting apparatus.

Figure 5:
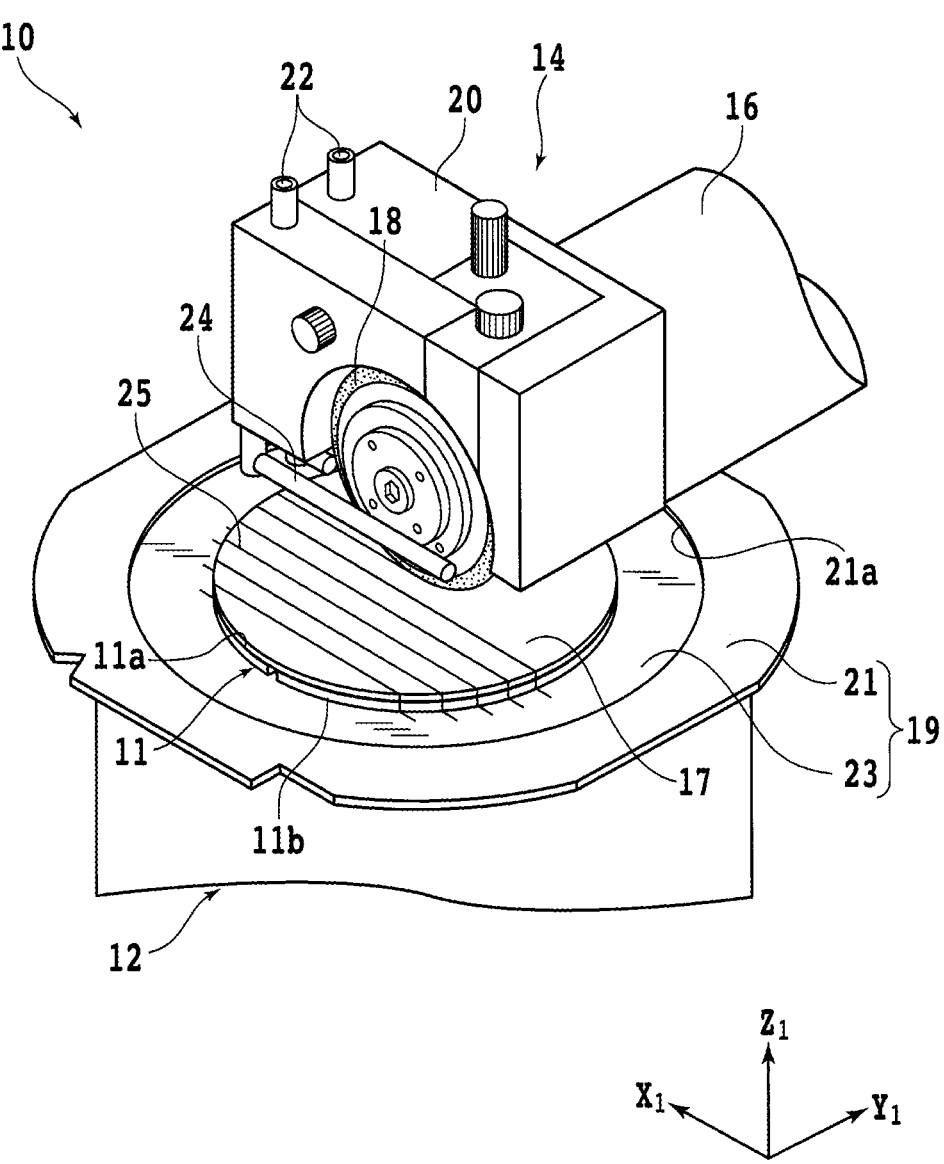
FIG. 5 is a perspective view illustrating a cutting apparatus.

FIG. 5 is a perspective view illustrating a cutting apparatus 10. In FIG. 5, an $X_1$-axis direction (processing feed direction, first horizontal direction) and a $Y_1$-axis direction (indexing feed direction, second horizontal direction) are directions perpendicular to each other. Furthermore, a $Z_1$-axis direction (vertical direction, upward-downward direction, height direction) is the direction perpendicular to the $X_1$-axis direction and the $Y_1$-axis direction.

The cutting apparatus 10 includes a chuck table (holding table) 12 that holds the workpiece 11. The upper surface of the chuck table 12 is a flat surface substantially parallel to the horizontal plane ($X_1Y_1$ plane) and configures a circular holding surface that holds the workpiece 11. The holding surface of the chuck table 12 is connected to a suction source (not illustrated) such as an ejector through a flow path (not illustrated) formed inside the chuck table 12, a valve (not illustrated), and so forth. To the chuck table 12, a movement mechanism (not illustrated) of a ball screw system and a rotational drive source (not illustrated) such as a motor are coupled. The movement mechanism moves the chuck table 12 along the $X_1$-axis direction. The rotational drive source rotates the chuck table 12 around a rotation axis substantially parallel to the $Z_1$-axis direction.

Furthermore, the cutting apparatus 10 includes a cutting unit 14 disposed over the chuck table 12. The cutting unit 14 includes a cylindrical housing 16, and a circular columnar spindle (not illustrated) disposed along the $Y_1$-axis direction is housed in the housing 16. A tip part (one end part) of the spindle is exposed to the external of the housing 16, and a rotational drive source (not illustrated) such as a motor is coupled to a base end part (the other end part) of the spindle. An annular cutting blade 18 is mounted on the tip part of the spindle. The cutting blade 18 rotates around a rotation axis substantially parallel to the $Y_1$-axis direction at a predetermined rotation speed by power transmitted from the rotational drive source through the spindle.

As the cutting blade 18, for example, a cutting blade of a hub type (hub blade) is used. The hub blade includes an annular base composed of a metal or the like and an annular cutting edge formed along the outer circumferential edge of the base. The cutting edge of the hub blade is configured by an electroformed abrasive stone including abrasive grains composed of diamond or the like and a bond such as a nickel plated layer that fixes the abrasive grains. Furthermore, it is also possible to use a cutting blade of a washer type (washer blade) as the cutting blade 18. The washer blade is configured by only an annular cutting edge including abrasive grains composed of diamond or the like and a bond that is composed of a metal, ceramic, a resin, or the like and fixed the abrasive grains.

The cutting blade 18 mounted in the cutting unit 14 is covered by a blade cover 20 fixed to a tip part of the housing 16. The blade cover 20 includes a pair of connecting parts 22 connected to a tube (not illustrated) that supplies liquid (cutting liquid) such as purified water and a pair of nozzles 24 connected to the pair of connecting parts 22. The pair of nozzles 24 are disposed to sandwich the cutting blade 18 on both surface sides (front and back surface sides) of a lower end part of the cutting blade 18. Furthermore, a supply port (not illustrated) that opens toward the cutting blade 18 is formed in each of the pair of nozzles 24. When the cutting liquid is supplied to the pair of connecting parts 22, the cutting liquid flows into the pair of nozzles 24, and the cutting liquid is supplied from the supply ports of the nozzles 24 toward both surfaces (front and back surfaces) of the cutting blade 18. By this cutting liquid, the workpiece 11 and the cutting blade 18 are cooled, and dust generated due to the cutting processing (cutting dust) is washed away.

A movement mechanism (not illustrated) of a ball screw system that moves the cutting unit 14 along the $Y_1$-axis direction and the $Z_1$-axis direction is coupled to the cutting unit 14. By the movement mechanism, the position of the cutting blade 18 in the indexing feed direction, the depth of cutting into the workpiece 11 regarding the cutting blade 18, and so forth are adjusted.

When the workpiece 11 is cut by the cutting apparatus 10, first, the workpiece 11 is disposed over the chuck table 12 with the interposition of the tape 23. At this time, the workpiece 11 is disposed in such a manner that the side of the front surface 11a (side of the sheet 17) is oriented upward and the side of the back surface 11b (side of the tape 23) faces the holding surface of the chuck table 12. When a suction force (negative pressure) of the suction source is caused to act on the holding surface of the chuck table 12 in this state, the workpiece 11 is sucked and held by the chuck table 12 with the interposition of the tape 23.

Next, the chuck table 12 is rotated, and a length direction of the predetermined street 13 (see FIG. 1) is adjusted to the $X_1$-axis direction. Furthermore, the position of the cutting unit 14 in the $Y_1$-axis direction is adjusted to cause the cutting blade 18 to be disposed on an extension line of the predetermined street 13. Moreover, the height of the cutting unit 14 (position in the $Z_1$-axis direction) is adjusted to cause the lower end of the cutting blade 18 to be disposed on the lower side relative to the back surface 11b of the workpiece 11 (upper surface of the tape 23). Then, the chuck table 12 is moved along the $X_1$-axis direction while the cutting blade 18 is rotated. This causes the chuck table 12 and the cutting blade 18 to relatively move along the $X_1$-axis direction and causes the cutting blade 18 to cut into the workpiece 11 along the street 13. As a result, the workpiece 11 and the sheet 17 are cut and divided along the street 13. Furthermore, in the region cut by the cutting blade 18 in the workpiece 11 and the sheet 17, a groove (cut groove) 25 that reaches the back surface 11b of the workpiece 11 from the upper surface of the sheet 17 is formed along the street 13.

Thereafter, by repeating a similar procedure, the workpiece 11 and the sheet 17 are cut along all streets 13 and the grooves 25 are formed. As a result, the workpiece 11 is divided into a plurality of device chips that each include the device 15 (see FIG. 1 and so forth) and to which individual pieces of the sheet 17 adhere.

When the workpiece 11 is cut by the cutting blade 18, cutting dust is generated in the contact region between the workpiece 11 and the cutting blade 18 and the cutting dust gets caught in the rotation of the cutting blade 18 and is scattered. However, because the side of the front surface 11a of the workpiece 11 is covered by the sheet 17, the cutting dust does not adhere to the front surface 11a of the workpiece 11 and the devices 15. This avoids contamination of the workpiece 11 and the devices 15 due to the cutting dust.

Figure 6:
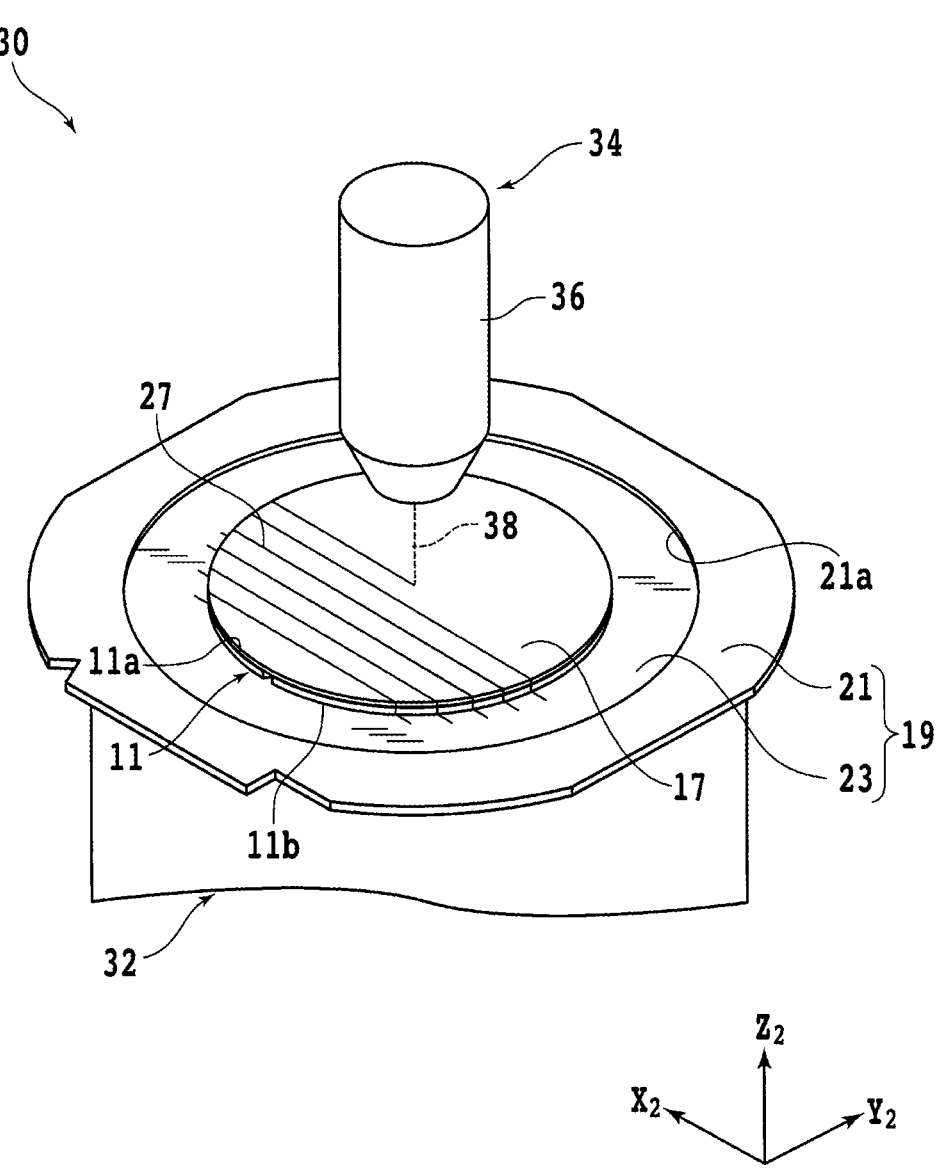
FIG. 6 is a perspective view illustrating a laser processing apparatus.

In the processing step, the workpiece 11 may be divided along the streets 13 (see FIG. 1 and so forth) by using the laser processing apparatus. FIG. 6 is a perspective view illustrating a laser processing apparatus 30. In FIG. 6, an $X_2$-axis direction (processing feed direction, first horizontal direction) and a $Y_2$-axis direction (indexing feed direction, second horizontal direction) are directions perpendicular to each other. Furthermore, a $Z_2$-axis direction (vertical direction, upward-downward direction, height direction) is the direction perpendicular to the $X_2$-axis direction and the $Y_2$-axis direction.

The laser processing apparatus 30 includes a chuck table (holding table) 32 that holds the workpiece 11. The configuration and functions of the chuck table 32 are similar to those of the chuck table 12 (see FIG. 5) of the cutting apparatus 10. Furthermore, to the chuck table 32, a movement mechanism (not illustrated) of a ball screw system and a rotational drive source (not illustrated) such as a motor are coupled. The movement mechanism moves the chuck table 32 along the $X_2$-axis direction and the $Y_2$-axis direction. The rotational drive source rotates the chuck table 32 around a rotation axis substantially parallel to the $Z_2$-axis direction.

Moreover, the laser processing apparatus 30 includes a laser irradiation unit 34 that executes irradiation with a laser beam. The laser irradiation unit 34 includes a laser oscillator (not illustrated) of a YAG laser, a $YVO_4$ laser, a YLF laser, or the like and a laser processing head 36 disposed over the chuck table 32. An optical system that guides a laser beam of pulse oscillation emitted from the laser oscillator to the workpiece 11 is housed in the laser processing head 36 and the optical system includes optical elements such as a collecting lens that focuses the laser beam. Laser processing is executed for the workpiece 11 by a laser beam 38 with which irradiation is executed from the laser irradiation unit 34.

When the workpiece 11 is processed by the laser processing apparatus 30, first, the workpiece 11 is disposed over the chuck table 32 with the interposition of the tape 23. At this time, the workpiece 11 is disposed in such a manner that the side of the front surface 11a (side of the sheet 17) is oriented upward and the side of the back surface 11b (side of the tape 23) faces the holding surface of the chuck table 32. When a suction force (negative pressure) of a suction source is caused to act on the holding surface of the chuck table 32 in this state, the workpiece 11 is sucked and held by the chuck table 32 with the interposition of the tape 23.

Next, the chuck table 32 is rotated and the length direction of the predetermined street 13 (see FIG. 1) is adjusted to the $X_2$-axis direction. Furthermore, the position of the chuck table 32 in the $Y_2$-axis direction is adjusted in such a manner that the region to be irradiated with the laser beam 38 overlaps with an extension line of the predetermined street 13. Moreover, the optical system of the laser irradiation unit 34 is adjusted to cause a focal point of the laser beam 38 to be positioned to the same height (position in the $Z_2$-axis direction) as the front surface 11a or the inside of the workpiece 11. Then, the chuck table 32 is moved along the X₂-axis direction while irradiation with the laser beam 38 from the laser processing head 36 is executed. This causes the chuck table 32 and the laser beam 38 to relatively move along the X₂-axis direction and causes the side of the front surface 11a of the workpiece 11 to be irradiated with the laser beam 38 along the street 13.

Irradiation conditions of the laser beam 38 are set to cause ablation processing to be executed for the workpiece 11, for example. Specifically, a wavelength of the laser beam 38 is set to cause at least part of the laser beam 38 to be absorbed by the workpiece 11. That is, the laser beam 38 is a laser beam having absorbability with respect to the workpiece 11. Furthermore, other irradiation conditions of the laser beam 38 are also set as appropriate to cause the ablation processing to be properly executed for the workpiece 11. For example, when the workpiece 11 is a single-crystal silicon wafer, irradiation conditions of the laser beam 38 can be set as follows.

Wavelength: 355 nm
Average output power: 2 W
Repetition frequency: 200 kHz
Processing feed rate: 400 mm/s When the workpiece 11 is irradiated with the laser beam 38 along the street 13, the region irradiated with the laser beam 38 (processed region) in the workpiece 11 is removed by ablation. Furthermore, the region that overlaps with the processed region in the workpiece 11 in the sheet 17 also ruptures due to the irradiation with the laser beam 38, impingement of a scattered object generated due to the ablation of the workpiece 11, and so forth. As a result, the workpiece 11 and the sheet 17 are divided along the street 13. Moreover, in the region processed by the laser beam 38 in the workpiece 11 and the sheet 17, a groove (laser processed groove) 27 that reaches the back surface 11b of the workpiece 11 from the upper surface of the sheet 17 is formed along the street 13.

Thereafter, by repeating a similar procedure, irradiation with the laser beam 38 is executed along all streets 13 and the grooves 27 are formed. As a result, the workpiece 11 is divided into a plurality of device chips that each include the device 15 (see FIG. 1 and so forth) and to which individual pieces of the sheet 17 adhere. When it is difficult to divide the workpiece 11 and the sheet 17 by one time of scanning with the laser beam 38, irradiation with the laser beam 38 may be executed a plurality of times along each street 13.

When the ablation processing is executed for the workpiece 11, a melt (debris) of the workpiece 11 is generated and scattered. However, because the side of the front surface 11a of the workpiece 11 is covered by the sheet 17, the debris does not adhere to the front surface 11a of the workpiece 11 and the devices 15. This avoids contamination of the workpiece 11 and the devices 15 due to the debris.

Furthermore, in the processing step, plasma treatment may be executed for the workpiece 11. For example, by executing the plasma etching for the workpiece 11 by using the plasma treatment apparatus, the workpiece 11 is divided along the streets 13 (see FIG. 1 and so forth) (plasma dicing).

Figure 7:
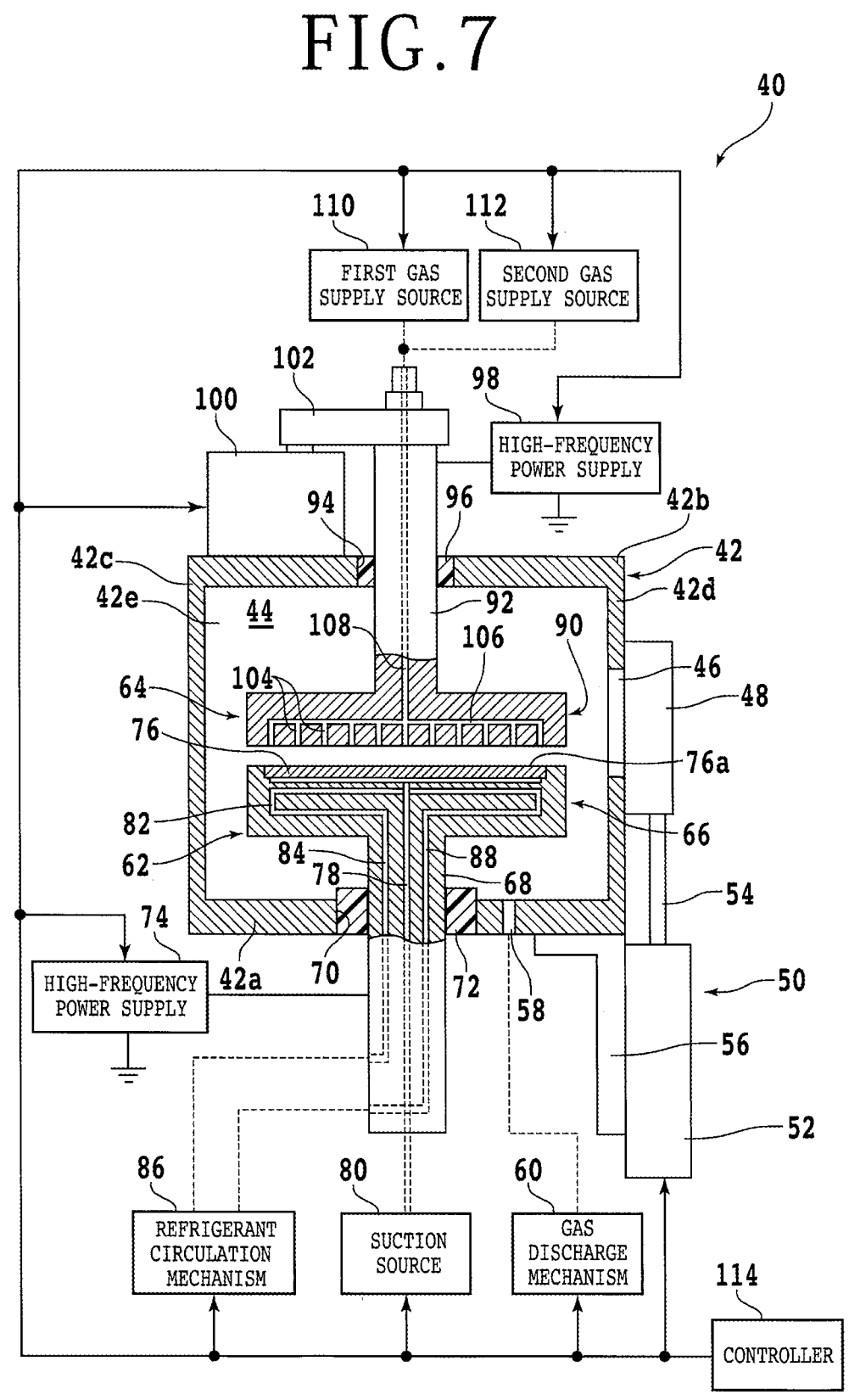
FIG. 7 is a partially sectional front view illustrating a plasma treatment apparatus.

FIG. 7 is a partially sectional front view illustrating a plasma treatment apparatus (plasma etching apparatus) 40. The plasma treatment apparatus 40 includes a chamber 42 with a rectangular parallelepiped shape. The chamber 42 includes a bottom wall 42a, an upper wall 42b, a first sidewall 42c, a second sidewall 42d, a third sidewall 42e, and a fourth sidewall (not illustrated). The inside of the chamber 42 is equivalent to a treatment space 44 in which plasma treatment is executed.

An opening 46 for carrying-in and carrying-out of the workpiece 11 is made in the second sidewall 42d. A gate (opening-closing door) 48 that opens and closes the opening 46 is disposed outside the opening 46. The gate 48 is connected to an opening-closing mechanism 50, and the opening-closing mechanism 50 moves the gate 48 along a vertical direction (upward-downward direction). For example, the opening-closing mechanism 50 is configured by an air cylinder 52 including a piston rod 54. The air cylinder 52 is fixed to the bottom wall 42a of the chamber 42 with the interposition of a bracket 56, and an upper end part of the piston rod 54 is coupled to the gate 48. When the gate 48 is lowered by the opening-closing mechanism 50, the opening 46 is exposed. This makes it possible to carry in the workpiece 11 to the treatment space 44 through the opening 46 or carry out the workpiece 11 from the treatment space 44 through the opening 46.

A gas discharge port 58 that connects the internal and external of the chamber 42 is formed in the bottom wall 42a of the chamber 42. A gas discharge mechanism 60 for reducing the pressure of the treatment space 44 is connected to the gas discharge port 58. The gas discharge mechanism 60 is configured by a vacuum pump, for example.

In the treatment space 44, a lower electrode 62 and an upper electrode 64 are disposed to face each other. The lower electrode 62 is composed of an electrically-conductive material and includes a holding part 66 with a circular disc shape and a circular columnar support part 68 that protrudes downward from a central part of the lower surface of the holding part 66. The support part 68 is inserted in an opening 70 formed in the bottom wall 42a of the chamber 42. An annular insulating component 72 is disposed between the bottom wall 42a and the support part 68 in the opening 70, and the chamber 42 and the lower electrode 62 are insulated by the insulating component 72. Furthermore, the lower electrode 62 is connected to a high-frequency power supply 74 at the external of the chamber 42.

A recess part is formed on the upper surface side of the holding part 66, and a circular disc-shaped table 76 that holds the workpiece 11 is disposed in this recess part. The upper surface of the table 76 configures a flat holding surface 76a that holds the workpiece 11. The holding surface 76a is connected to a suction source 80 such as an ejector through a flow path (not illustrated) formed inside the table 76 and a flow path 78 formed inside the lower electrode 62.

Moreover, a cooling flow path 82 is formed inside the holding part 66. One end side of the cooling flow path 82 is connected to a refrigerant circulation mechanism 86 through a refrigerant introduction path 84 formed in the support part 68. Furthermore, the other end side of the cooling flow path 82 is connected to the refrigerant circulation mechanism 86 through a refrigerant discharge path 88 formed in the support part 68. When the refrigerant circulation mechanism 86 is actuated, a refrigerant flows in the refrigerant introduction path 84, the cooling flow path 82, and the refrigerant discharge path 88 sequentially, and the lower electrode 62 is cooled.

The upper electrode 64 is composed of an electrically-conductive material and includes a gas ejecting part 90 with a circular disc shape and a circular columnar support part 92 that protrudes upward from a central part of the upper surface of the gas ejecting part 90. The support part 92 is inserted in an opening 94 formed in the upper wall 42b of the chamber 42. An annular insulating component 96 is disposed between the upper wall 42b and the support part 92 in the opening 94, and the chamber 42 and the upper electrode 64 are insulated by the insulating component 96. Furthermore, the upper electrode 64 is connected to a high-frequency power supply 98 at the external of the chamber 42.

A support arm 102 coupled to a raising-lowering mechanism 100 is mounted on an upper end part of the support part 92. When the support arm 102 is raised and lowered by the raising-lowering mechanism 100, the upper electrode 64 moves (rises and lowers) along the vertical direction (upward-downward direction).

A plurality of ejection ports 104 are made on the lower surface side of the gas ejecting part 90. The ejection ports 104 are connected to a first gas supply source 110 and a second gas supply source 112 through a flow path 106 formed inside the gas ejecting part 90 and a flow path 108 formed inside the support part 92. The first gas supply source 110 and the second gas supply source 112 can supply gases of components different from each other to the flow path 108.

The respective constituent elements of the plasma treatment apparatus 40 (opening-closing mechanism 50, gas discharge mechanism 60, high-frequency power supply 74, suction source 80, refrigerant circulation mechanism 86, high-frequency power supply 98, raising-lowering mechanism 100, first gas supply source 110, second gas supply source 112, and so forth) are connected to a controller (control unit, control device) 114 that controls the plasma treatment apparatus 40. The controller 114 generates a control signal that controls operation of each of the constituent elements of the plasma treatment apparatus 40. For example, the controller 114 is configured by a computer and includes a calculating section that executes calculation necessary for operation of the plasma treatment apparatus 40 and a storing section that stores various kinds of information (data, program, and so forth) used for the operation of the plasma treatment apparatus 40. The calculating section includes a processor such as a central processing unit (CPU). Moreover, the storing section is configured to include a memory such as a read only memory (ROM) or a random access memory (RAM).

When plasma etching is executed for the workpiece 11 by the plasma treatment apparatus 40, first, the gate 48 of the plasma treatment apparatus 40 is lowered by the opening-closing mechanism 50, and the opening 46 is exposed. Then, by a conveying mechanism (not illustrated), the workpiece 11 is carried in to the treatment space 44 of the chamber 42 through the opening 46 and is disposed over the table 76. At the time of the carrying-in of the workpiece 11, it is preferable to raise the upper electrode 64 by the raising-lowering mechanism 100 to widen the interval between the lower electrode 62 and the upper electrode 64 in advance.

Next, a negative pressure of the suction source 80 is caused to act on the holding surface 76a of the table 76, and the workpiece 11 is sucked and held by the table 76. Furthermore, the gate 48 is raised by the opening-closing mechanism 50, and the opening 46 is closed to seal the treatment space 44. Moreover, a height of the upper electrode 64 is adjusted by the raising-lowering mechanism 100 to cause the upper electrode 64 and the lower electrode 62 to have a predetermined positional relationship suitable for the plasma etching. Then, the gas discharge mechanism 60 is actuated to set the treatment space 44 to a pressure-reduced state (for example, at least 50 Pa and at most 300 Pa). In the case in which it becomes difficult to hold the workpiece 11 over the table 76 by the negative pressure of the suction source 80 when the pressure of the treatment space 44 is reduced, the workpiece 11 is held over the table

76 by an electric force (typically electrostatic attraction) or the like. For example, a plurality of electrodes are buried inside the table 76. By applying a predetermined voltage to these electrodes, a Coulomb force can be caused to act between the table 76 and the workpiece 11 and suction adhesion of the workpiece 11, to the table 76 can be achieved. That is, the table 76 functions as an electrostatic chuck table.

Then, gas for etching (etching gas) is supplied from the first gas supply source 110 or the second gas supply source 112 to between the lower electrode 62 and the upper electrode 64 through the flow path 108, the flow path 106, and the plurality of ejection ports 104. Furthermore, predetermined high-frequency power (for example, at least 1000 W and at most 3000 W) is given to the lower electrode 62 and the upper electrode 64. As a result, the etching gas that exists between the lower electrode 62 and the upper electrode 64 becomes a plasma state containing ions and radicals. Then, the gas in the plasma state is supplied to the workpiece 11, and the plasma etching is executed for the workpiece 11.

Figure 8:
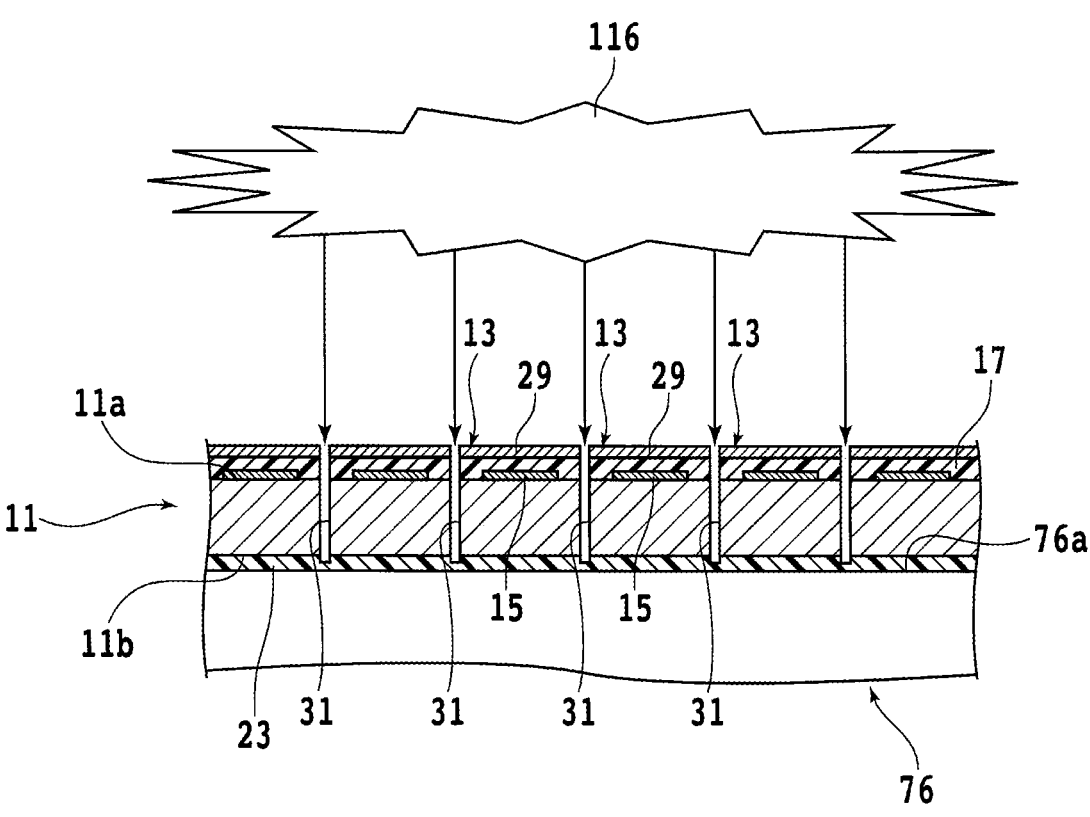
FIG. 8 is a sectional view illustrating part of the workpiece for which plasma etching is executed.

FIG. 8 is a sectional view illustrating part of the workpiece 11 for which the plasma etching is executed. When the plasma etching is executed for the workpiece 11, a mask 29 is formed on the sheet 17. For example, the mask 29 is formed by applying a resist composed of a photosensitive resin on the sheet 17 and patterning the resist to expose regions that overlap with the streets 13 in the sheet 17. However, there is no limit on the material and the forming method of the mask 29. For example, the mask 29 composed of a water-soluble resin may be formed by applying, on the sheet 17, a film composed of the water-soluble resin such as polyvinyl alcohol (PVA), polyethylene glycol (PEG), polyethylene oxide (PEO), or polyvinyl pyrrolidone (PVP) and thereafter patterning this film by irradiation with a laser beam, or the like.

The workpiece 11 is disposed over the table 76 in such a manner that the side of the front surface 11a (side of the sheet 17) is oriented upward and the side of the back surface 11b (side of the tape 23) faces the holding surface 76a. Then, gas (etching gas) 116 in the plasma state is supplied to the sheet 17 and the workpiece 11 through the openings of the mask 29. Thereby, regions that overlap with the streets 13 in the workpiece 11 and the sheet 17 are removed by etching and grooves 31 that reach the back surface 11b of the workpiece 11 from the upper surface of the sheet 17 are formed along the streets 13. As a result, the workpiece 11 and the sheet 17 are divided along the streets 13.

The plasma treatment apparatus 40 illustrated in FIG. 7 can execute etching of the workpiece 11 and the sheet 17 by using etching gases of different components. For example, the plasma treatment apparatus 40 turns gas supplied from the first gas supply source 110 to plasma to use it for etching of the sheet 17, and turns gas supplied from the second gas supply source 112 to plasma to use it for etching of the workpiece 11.

When the plasma etching is executed for the workpiece 11 and the sheet 17, part of the component of the etching gas adheres onto the workpiece 11 and is deposited in some cases. However, because the side of the front surface 11a of the workpiece 11 is covered by the sheet 17, the deposited object does not adhere to the front surface 11a of the workpiece 11 and the devices 15. This avoids contamination of the workpiece 11 and the devices 15 due to the deposited object. Furthermore, after the plasma etching of the workpiece 11 and the sheet 17, treatment to remove the mask 29 is executed. At this time, because the side of the front surface 11a of the workpiece 11 is covered by the sheet 17, a chemical or the like for removing the mask 29 can be prevented from adhering to the front surface 11a of the workpiece 11 and the devices 15.

As described above, in the processing step, the workpiece 11 is processed together with the sheet 17 by causing the cutting blade 18 (see FIG. 5) to cut into the workpiece 11 and the sheet 17 or irradiating the workpiece 11 and the sheet 17 with the laser beam 38 (see FIG. 6) or supplying the gas 116 (see FIG. 8) in the plasma state to the workpiece 11 and the sheet 17. However, the kind and contents of the processing executed for the workpiece 11 and the sheet 17 in the processing step are not limited to the above description.

Next, a unifying step of unifying the processed sheet 17 (step S4) is executed. In the unifying step, by heating the sheet 17 in the state of being divided into a plurality of individual pieces and melting the sheet 17, the plurality of individual pieces are joined and the sheet 17 is unified.

Figure 9A:
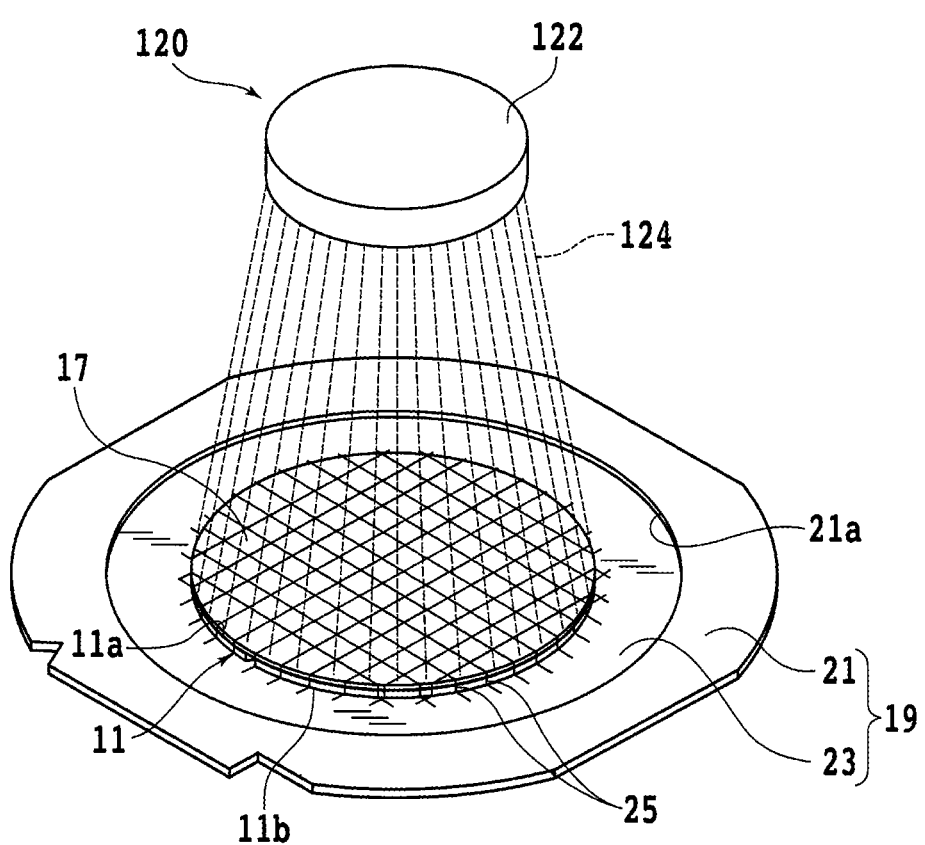
FIG. 9A is a perspective view illustrating the workpiece and the first sheet in a unifying step.

FIG. 9A is a perspective view illustrating the workpiece 11 and the sheet 17 in the unifying step. For example, the sheet 17 is heated by a heating unit 120. The heating unit 120 includes a chuck table (not illustrated) that supports the workpiece 11 and a heat source 122 that heats the sheet 17. The heating unit 120 may be included in the processing apparatus that processes the workpiece 11 in the processing step or may be installed independently of the processing apparatus. For example, the heat source 122 includes a heat generating mechanism such as a heating wire and a blast mechanism such as a fan, and heats gas such as air and jets the gas as a hot wind 124. The sheet 17 is heated by holding the workpiece 11 by the chuck table and blowing the hot wind 124 from the heat source 122 into the sheet 17.

Figure 9B:
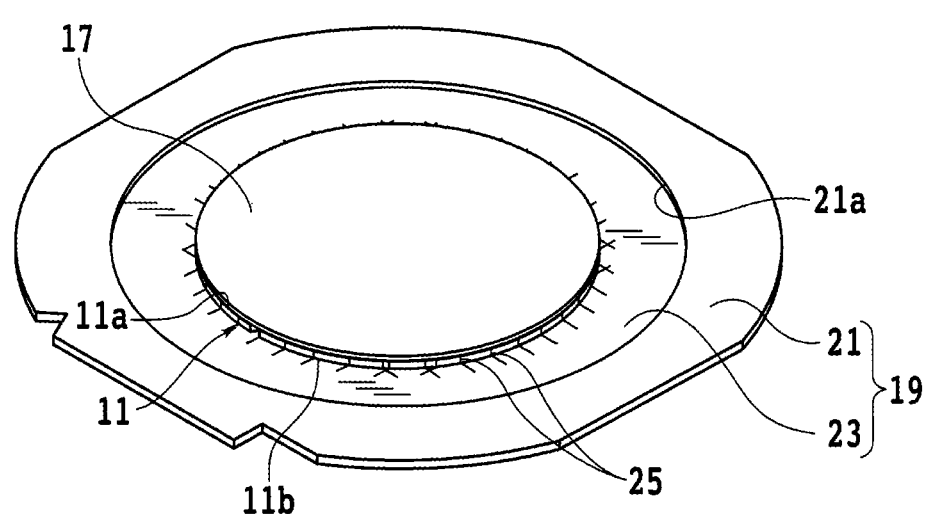
FIG. 9B is a perspective view illustrating the workpiece and the first sheet after the unifying step.

The sheet 17 is heated until the temperature of the sheet 17 reaches the melting point of the sheet 17. Thereby, the individual pieces of the sheet 17 each melt and are joined to each other, so that the grooves 25 formed in the sheet 17 disappear. As a result, the sheet 17 is unified to become one circular component. FIG. 9B is a perspective view illustrating the workpiece 11 and the sheet 17 after the unifying step. When the unifying step is executed, the sheet 17 is unified and returns to a state similar to that before the processing (see FIG. 4B). There is no limit on the heating method of the sheet 17. For example, the sheet 17 may be heated by using an infrared lamp as the heat source 122 and irradiating the sheet 17 with infrared from the infrared lamp.

Next, a separation step of separating the sheet 17 from the workpiece 11 (step S5) is executed. In the separation step, a second sheet composed of a thermoplastic resin is thermo-compression-bonded to the sheet 17 and thereafter the sheet 17 is separated from the workpiece 11 by moving the second sheet. For example, a separating apparatus is used for the separation of the sheet 17.

Figure 10:
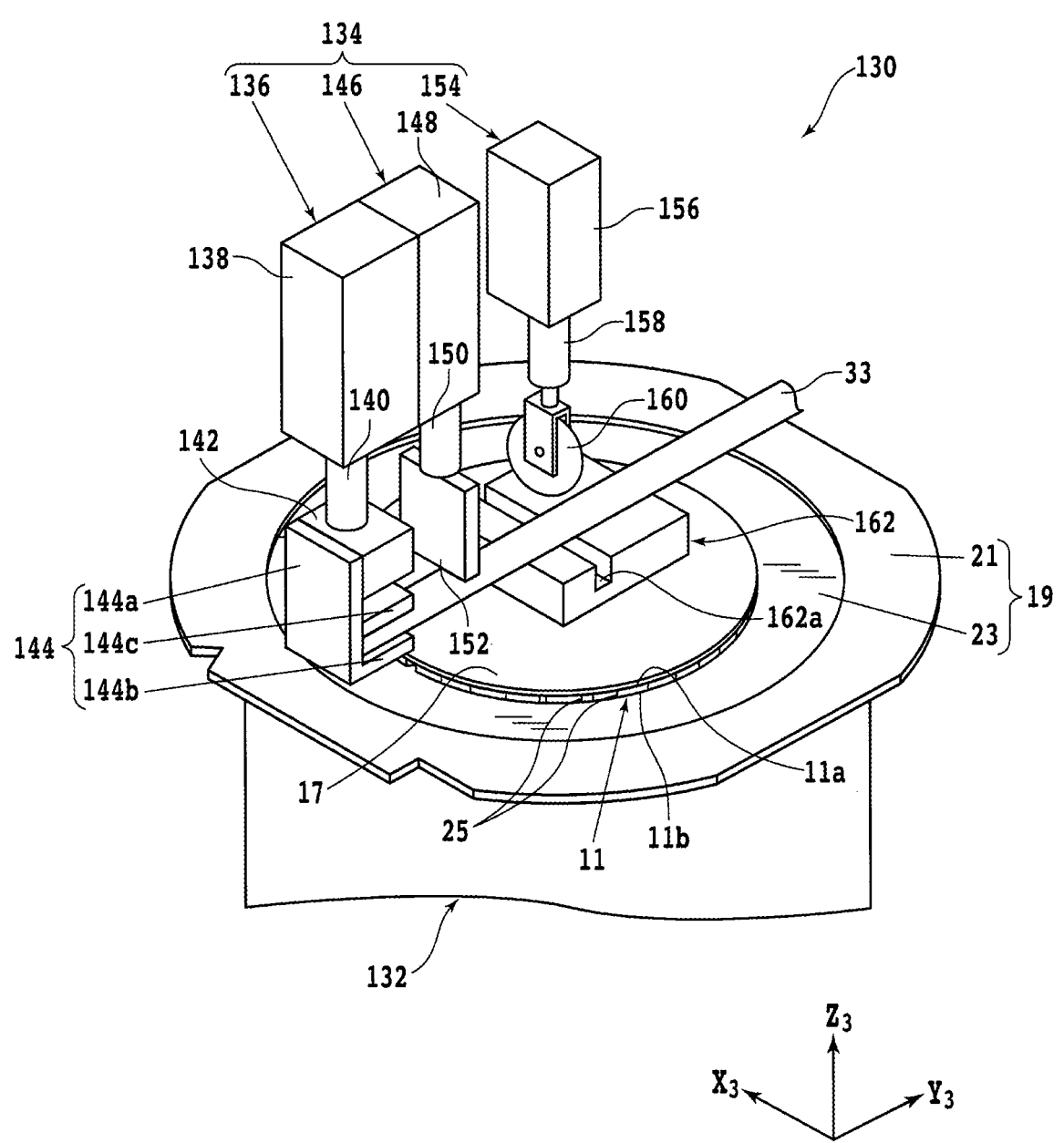
FIG. 10 is a perspective view illustrating a separating apparatus.

FIG. 10 is a perspective view illustrating a separating apparatus 130. In FIG. 10, an $X_3$-axis direction (first horizontal direction) and a $Y_3$-axis direction (second horizontal direction) are directions perpendicular to each other. Furthermore, a $Z_3$-axis direction (vertical direction, upward-downward direction, height direction) is the direction perpendicular to the $X_3$-axis direction and the $Y_3$-axis direction. The separating apparatus 130 may be included in the processing apparatus that processes the workpiece 11 in the processing step or may be installed independently of the processing apparatus.

The separating apparatus 130 includes a chuck table (holding table) 132 that holds the workpiece 11 and a separating unit 134 that separates the sheet 17 from the workpiece 11. The separating apparatus 130 holds the workpiece 11 to which the sheet 17 is fixed by the chuck table 132, causes thermocompression bonding of a sheet (sheet for separation, second sheet) 33 composed of a thermoplastic resin to the sheet 17, and separates the sheet 17 and the sheet 33 from the workpiece 11. The upper surface of the chuck table 132 is a flat surface substantially parallel to the horizontal plane ($X_3Y_3$ plane) and configures a circular holding surface that holds the workpiece 11. The holding surface of the chuck table 132 is connected to a suction source (not illustrated) such as an ejector through a flow path (not illustrated) formed inside the chuck table 132, a valve (not illustrated), and so forth.

The separating unit 134 includes a holding mechanism 136 that holds the sheet 33. For example, the holding mechanism 136 has an air cylinder 138 including a piston rod 140, and the air cylinder 138 raises and lowers the piston rod 140 along the $Z_3$-axis direction. A support component 142 with a rectangular parallelepiped shape is fixed to a lower end part of the piston rod 140.

Furthermore, a grasping mechanism 144 that grasps the sheet 33 is mounted on the support component 142. The grasping mechanism 144 includes a sidewall 144a with a flat plate shape and a pair of flat plate-shaped grasping components 144b and 144c that protrude along the $Y_3$-axis direction from a side surface of the sidewall 144a. The grasping components 144b and 144c are disposed substantially in parallel to each other along the $Y_3$-axis direction. The grasping component 144b is coupled to a lower end part of the sidewall 144a, and the grasping component 144c is disposed to overlap with the grasping component 144b above the grasping component 144b. Moreover, a movement mechanism (not illustrated) is coupled to the grasping component 144c and the movement mechanism slides the grasping component 144c in the $Z_3$-axis direction along the sidewall 144a. In the state in which an end part of the sheet 33 is inserted between the pair of grasping components 144b and 144c, the grasping component 144c is lowered to be brought close to the grasping component 144b. This causes the end part of the sheet 33 to be grasped by the grasping components 144b and 144c.

The sheet 33 is a sheet composed of a thermoplastic resin that can be thermocompression-bonded to the sheet 17, and does not include an adhesive (glue layer). Examples of the material of the sheet 33 are similar to those of the sheet 17. That is, as the sheet 33, an olefin-based sheet, a styrene-based sheet, a polyester-based sheet, or the like can be used. For example, the material of the sheet 17 and the material of the sheet 33 are the same. Alternatively, the material of the sheet 17 and the material of the sheet 33 may be different and the melting point of the sheet 33 may be lower than that of the sheet 17. For example, the sheet 33 is formed into a strip shape, is fixed to a roller (not illustrated), and is taken up. Furthermore, a tip of the sheet 33 sent out from the roller is grasped by the pair of grasping components 144b and 144c.

Moreover, the separating unit 134 includes a heating mechanism 146 that heats the sheet 33. For example, the heating mechanism 146 has an air cylinder 148 including a piston rod 150, and the air cylinder 148 raises and lowers the piston rod 150 along the $Z_3$-axis direction. The air cylinder 148 is disposed adjacent to the air cylinder 138 in the $Y_3$-axis direction. A heating component (heating plate) 152 is fixed to a lower end part of the piston rod 150. For example, the heating component 152 is a flat plate-shaped component composed of a metal and is disposed substantially in parallel to the $X_3$-axis direction and the $Z_3$-axis direction. Furthermore, a heat source such as a heating wire is disposed inside the heating component 152, and the heating component 152 is heated to a predetermined temperature by heat generation of the heat source. When the sheet 33 is held by the holding mechanism 136, part of the sheet 33 is disposed at a position that overlaps with the heating component 152.

Moreover, the separating unit 134 includes a cutting mechanism 154 that cuts the sheet 33. For example, the cutting mechanism 154 has an air cylinder 156 including a piston rod 158 and the air cylinder 156 raises and lowers the piston rod 158 along the $Z_3$-axis direction. A cutter (blade) 160 is mounted on a lower end part of the piston rod 158. The cutter 160 is a circular disc-shaped component composed of a metal or the like and is disposed substantially in parallel to the $X_3$-axis direction and the $Z_3$-axis direction. Furthermore, a rotational drive source (not illustrated) such as a motor is coupled to the cutter 160 and the rotational drive source rotates the cutter 160 around a rotation axis substantially parallel to the $Y_3$-axis direction. Moreover, the cutting mechanism 154 includes a support pedestal 162 that supports the sheet 33. For example, the support pedestal 162 is a rectangular parallelepiped component composed of a metal, a resin, or the like and is disposed under the sheet 33. Furthermore, a groove 162a is made along the $X_3$-axis direction on the upper surface side of the support pedestal 162. The width of the groove 162a is wider than that of the cutter 160 and a lower end part of the cutter 160 can be inserted in the groove 162a.

A movement mechanism (not illustrated) of a ball screw system included in the separating apparatus 130 is coupled to the separating unit 134. The movement mechanism moves the holding mechanism 136 and the heating mechanism 146 along the $Y_3$-axis direction. Moreover, the movement mechanism moves the cutting mechanism 154 along the $X_3$-axis direction and the $Y_3$-axis direction independently of the holding mechanism 136 and the heating mechanism 146.

When the sheet 17 is separated from the workpiece 11 by using the separating apparatus 130, first, the workpiece 11 is disposed over the holding surface of the chuck table 132 with the interposition of the tape 23. When a suction force (negative pressure) of the suction source is caused to act on the holding surface of the chuck table 132 in this state, the workpiece 11 is sucked and held by the chuck table 132 with the interposition of the tape 23.

Next, the holding mechanism 136 and the heating mechanism 146 are moved and the sheet 33 and the heating component 152 are disposed above the workpiece 11. One end side of the sheet 33 is grasped by the grasping mechanism 144 and the other end side of the sheet 33 is taken up by the roller (not illustrated). In addition, the sheet 33 is positioned to overlap with the sheet 17 fixed to the workpiece 11 in the state in which the sheet 33 is stretched between the grasping mechanism 144 and the roller. Furthermore, the heating component 152 is positioned to overlap with the sheet 17 and the sheet 33.

Next, the piston rod 150 is lowered while the heating component 152 is heated to a predetermined temperature. Due to this, the heating component 152 gets contact with the sheet 33 located directly under it and the sheet 33 is heated. Moreover, the sheet 33 is pressed down by the heating component 152 and is pressed against the sheet 17 fixed to the workpiece 11. This causes the sheet 33 to be heated and pressurized and be thermocompression-bonded to the sheet 17. The heating temperature of the sheet 33 is set as appropriate to cause the sheet 33 to be thermocompression-bonded to the sheet 17. Specific examples of the heating temperature of the sheet 33 are similar to those of the heating temperature of the sheet 17 in the thermocompression bonding step (see FIG. 3B).

Next, the positions of the holding mechanism 136 and the support pedestal 162 are adjusted to cause the sheet 33 to be supported by the upper surface side of the support pedestal 162. Furthermore, the position of the cutting mechanism 154 is adjusted to cause the cutter 160 to overlap with the groove 162a of the support pedestal 162. Then, the piston rod 158 is lowered and the lower end part of the cutter 160 is inserted into the groove 162a of the support pedestal 162. Thereafter, the cutter 160 is caused to cut into the sheet 33 by moving the cutting mechanism 154 along the $X_3$-axis direction while rotating the cutter 160. Thereby, the sheet 33 is cut and the tip side of the sheet 33 (on the side of the grasping mechanism 144) is cut off.

Figure 11A:
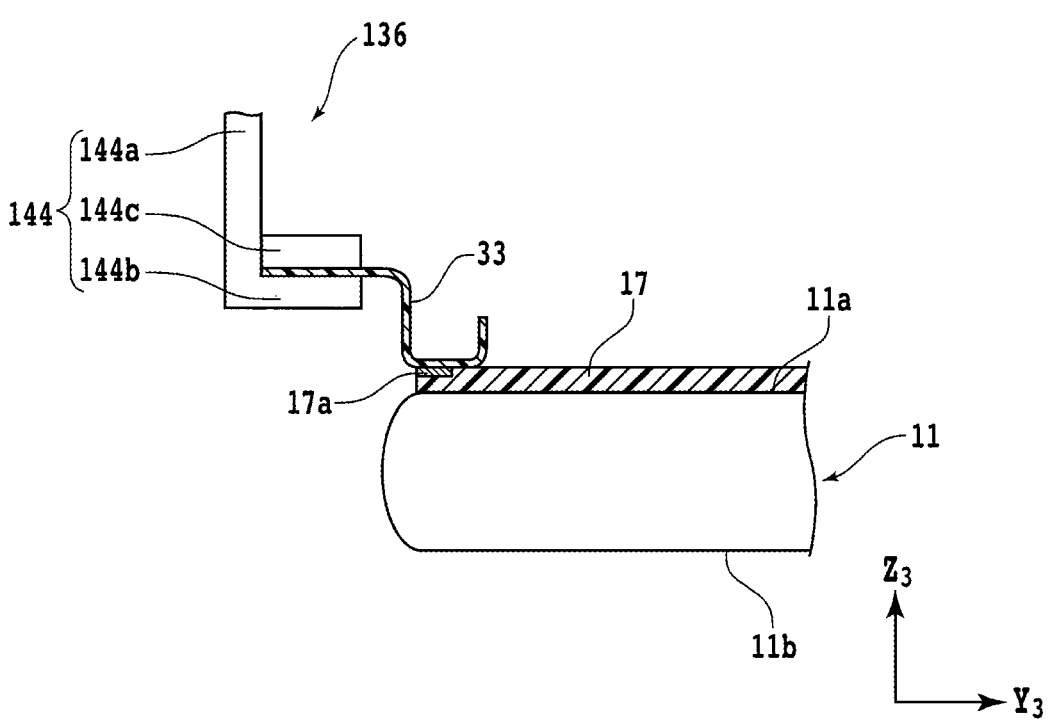
FIG. 11A is a partially sectional front view illustrating the first sheet to which a second sheet has been thermocompression-bonded.

FIG. 11A is a partial sectional front view illustrating the sheet 17 to which the sheet 33 has been thermocompression-bonded. When the sheet 33 is pressed against the sheet 17 while being heated by the heating component 152 (see FIG. 10), the sheet 33 and a region 17a that gets contact with the sheet 33 in the sheet 17 are heated and the sheet 33 is thermocompression-bonded to the region 17a of the sheet 17. Due to this, the sheet 17 and the sheet 33 are joined and the sheet 33 firmly gets close contact with the sheet 17.

Figure 11B:
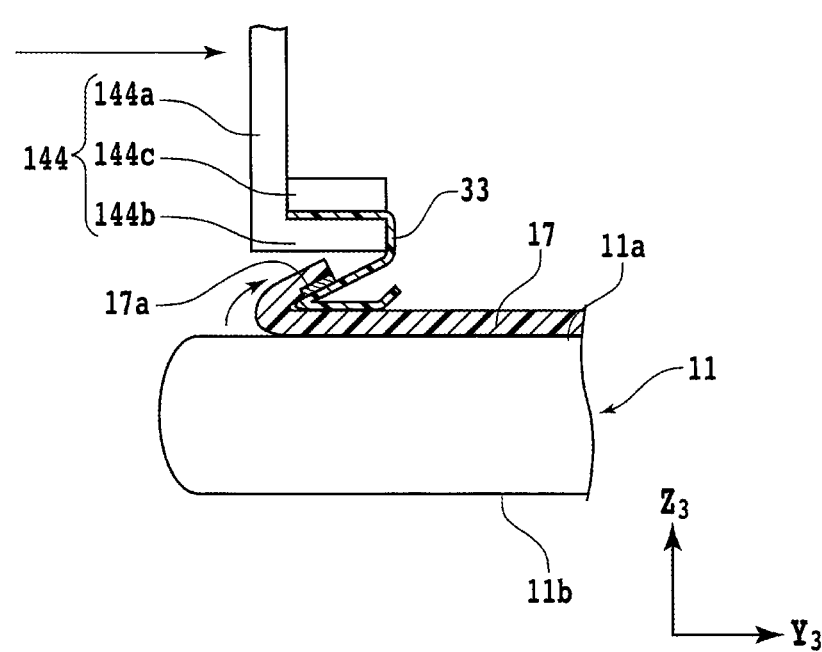
FIG. 11B is a partially sectional front view illustrating the first sheet separated from the workpiece.

FIG. 11B is a partial sectional front view illustrating the sheet 17 separated from the workpiece 11. When the grasping mechanism 144 is moved toward the other end side of the sheet 17 after the sheet 33 is thermocompression-bonded to the one end part of the sheet 17, the sheet 33 is pulled by the grasping mechanism 144 and the one end part of the sheet 17 follows the sheet 33 and moves toward the other end side of the sheet 17. This causes the sheet 17 to be separated from the workpiece 11. However, there is no limit on the direction in which the sheet 33 is pulled. For example, the sheet 33 may be pulled upward to separate the sheet 17 by raising the grasping mechanism 144 along the $Z_3$-axis direction.

By the above-described separation step, the sheet 17 is separated from the workpiece 11. Because the sheet 17 is composed of the thermoplastic resin that does not include an adhesive (glue layer), the adhesive does not remain on the side of the front surface 11a of the workpiece 11 after separation of the sheet 17. This avoids contamination of the workpiece 11 and the devices 15 (see FIG. 1) due to a residue of the adhesive. Moreover, in the separation step, the sheet 17 is separated from the workpiece 11 by using the sheet 33 fixed to the sheet 17 by the thermocompression bonding. Due to this, even when the sheet 17 is firmly in close contact with the workpiece 11 through thermocompression bonding, the adhesiveness between the sheet 17 and the sheet 33 can be made equivalent to or higher than the adhesiveness between the workpiece 11 and the sheet 17 and it is possible to prevent the sheet 33 from detaching from the sheet 17 in the separation of the sheet 17.

As above, in the processing method of a workpiece according to the present embodiment, after the sheet 33 is thermocompression-bonded to the processed sheet 17, the sheet 17 is separated from the workpiece 11 by moving the sheet 33. Due to this, the separation of the sheet 17 can be executed in the state in which the adhesiveness between the sheet 17 and the sheet 33 is high, and detachment between the sheet 17 and the sheet 33 in the separation is prevented. As a result, it becomes possible to surely separate the sheet 17 firmly fixed to the workpiece 11 by the thermocompression bonding.

In the above-described embodiment, description has been made about the example in which the sheet 17 is separated from the workpiece 11 after the unifying step (see FIG. 9A and FIG. 9B) of unifying the processed sheet 17 is executed. However, it is also possible to omit the unifying step. In this case, the whole of the sheet 17 is separated from the workpiece 11 by fixing a sheet for separation to the whole of the processed sheet 17. Another example of the separation step will be described with reference to FIG. 12A and FIG. 12B.

Figure 12A:
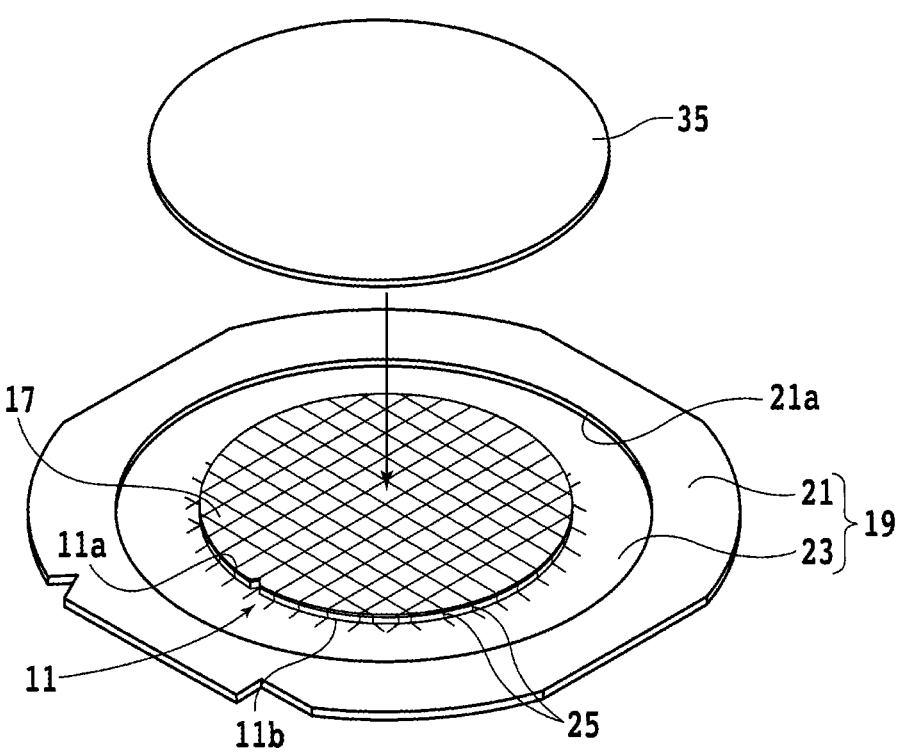
FIG. 12A is a perspective view illustrating the first sheet to which the second sheet is thermocompression-bonded.

FIG. 12A is a perspective view illustrating the sheet 17 to which a sheet (sheet for separation, second sheet) 35 is thermocompression-bonded. After execution of the processing step (see FIG. 5 to FIG. 8), the sheet 35 composed of a plastic resin is thermocompression-bonded to the processed sheet 17. The sheet 35 is a sheet composed of a thermoplastic resin that can be thermocompression-bonded to the sheet 17, and does not include an adhesive (glue layer). Examples of the material of the sheet 35 are similar to those of the sheet 17. That is, as the sheet 35, an olefin-based sheet, a styrene-based sheet, a polyester-based sheet, or the like can be used. For example, the material of the sheet 17 and the material of the sheet 35 are the same. Alternatively, the material of the sheet 17 and the material of the sheet 35 may be different and the melting point of the sheet 35 may be lower than that of the sheet 17. The shape and the size of the sheet 35 are set to allow the sheet 35 to cover the whole of the sheet 17. For example, the sheet 35 is formed into a circular shape and a diameter of the sheet 35 is equal to or larger than that of the sheet 17. However, there is no limit on the shape of the sheet 35. For example, the sheet 35 may be formed into a rectangular shape having a length and a width equal to or larger than the diameter of the sheet 17.

In the separation step, the sheet 35 is thermocompression-bonded to the sheet 17 divided into a plurality of individual pieces. Specifically, first, the sheet 35 is disposed on the side of the front surface 11a of the workpiece 11 to cover all individual pieces of the sheet 17. Next, the sheet 35 is pressed against the sheet 17 while being heated. For example, the sheet 35 is heated and pressurized by the above-described heating unit 2 (see FIG. 3B). This causes the sheet 35 to soften and get close contact with the sheet 17, so that the sheet 35 is thermocompression-bonded to the sheet 17. The heating temperature of the sheet 35 is set as appropriate to cause the sheet 35 to be thermocompression-bonded to the sheet 17. Specific examples of the heating temperature of the sheet 35 are similar to those of the heating temperature of the sheet 17 in the thermocompression bonding step (see FIG. 3A and FIG. 3B).

Figure 12B:
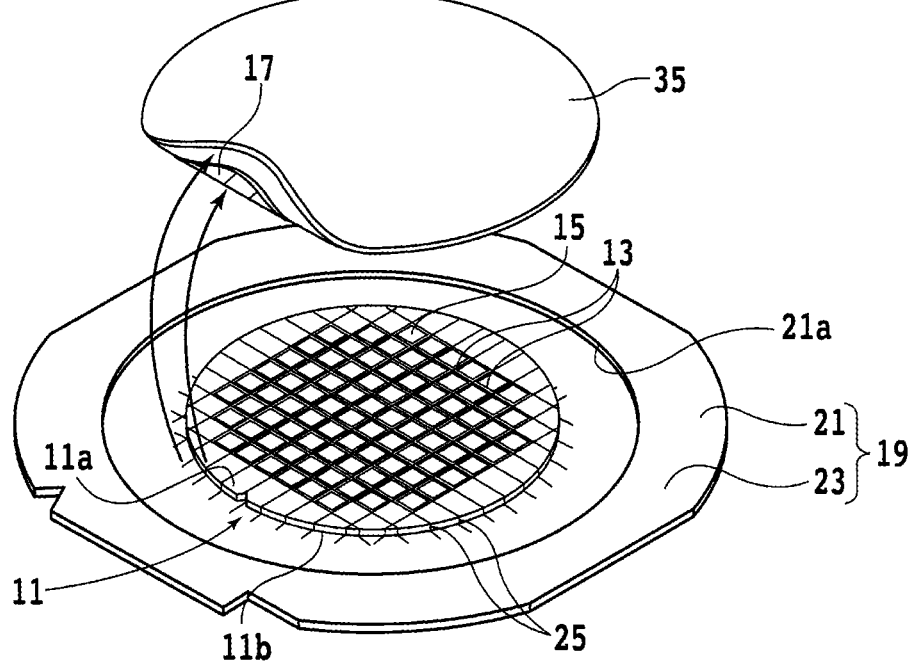
FIG. 12B is a perspective view illustrating the first sheet separated from the workpiece.

FIG. 12B is a perspective view illustrating the sheet 17 separated from the workpiece 11. After the sheet 35 is thermocompression-bonded to the sheet 17, for example, an end part of the sheet 35 is grasped and is moved in such a direction as to get farther away from the workpiece 11. This causes the sheet 17 to follow the sheet 35 and be separated from the workpiece 11.

Besides, structures, methods, and so forth according to the above-described embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a workpiece by which the workpiece is processed, the processing method comprising:
   a thermocompression bonding step of executing thermo-compression bonding of a first sheet composed of a thermoplastic resin to a front surface side of the workpiece by disposing the first sheet on the front surface side of the workpiece and heating the first sheet;
   a processing step of processing the workpiece together with the first sheet; and
   a separation step of separating the first sheet from the workpiece by moving a second sheet composed of a thermoplastic resin after executing thermocompression bonding of the second sheet to the first sheet by disposing the second sheet on the first sheet processed and heating the second sheet,
   wherein the second sheet is an olefin-based sheet or a styrene-based sheet.

2. The processing method of a workpiece according to claim 1, wherein,
   in the processing step, the workpiece is processed together with the first sheet by causing a cutting blade to cut into the workpiece and the first sheet or irradiating the workpiece and the first sheet with a laser beam or supplying gas in a plasma state to the workpiece and the first sheet.

3. The processing method of a workpiece according to claim 1, further comprising:
   a support component disposing step of disposing a support component on a back surface side of the workpiece before the processing step.

4. The processing method of a workpiece according to claim 1, further comprising:
   a unifying step of unifying the first sheet processed, before the separation step, by heating and melting the first sheet processed.

5. The processing method of a workpiece according to claim 1, wherein
   devices are formed on the front surface side of the workpiece.

6. The processing method of a workpiece according to claim 1, wherein the first sheet and the second sheet do not contain an adhesive.

7. A processing method of a workpiece by which the workpiece is processed, the processing method comprising:
   a thermocompression bonding step of executing thermo-compression bonding of a first sheet composed of a thermoplastic resin to a front surface side of the workpiece by disposing the first sheet on the front surface side of the workpiece and heating the first sheet;
   a processing step of processing the workpiece together with the first sheet; and
   a separation step of separating the first sheet from the workpiece by moving a second sheet composed of a thermoplastic resin after executing thermocompression bonding of the second sheet to the first sheet by disposing the second sheet on the first sheet processed, heating the second sheet, disposing a support pedestal which supports the second sheet and which includes a groove directly below the second sheet, positioning a cutter above the groove of the support pedestal, and lowering the cutter to cut the second sheet.

8. The processing method of a workpiece according to claim 7, wherein the first sheet and the second sheet do not contain an adhesive.

9. The processing method of a workpiece according to claim 7, wherein the cutter is a circular disc-shaped blade.

10. The processing method of a workpiece according to claim 7, wherein the support pedestal is in the shape of a rectangular parallelepiped.

11. The processing method of a workpiece according to claim 7, wherein the support pedestal is disposed directly on top of the first sheet.

5

* * * * *